United States Patent [19]
Elliott et al.

[11] Patent Number: 5,814,156
[45] Date of Patent: Sep. 29, 1998

[54] PHOTOREACTIVE SURFACE CLEANING

[75] Inventors: David J. Elliott, Wayland; Richard F. Hollman, Chelmsford, both of Mass.

[73] Assignee: UVTech Systems Inc., Wayland, Mass.

[21] Appl. No.: 745,711

[22] Filed: Nov. 12, 1996

Related U.S. Application Data

[63] Continuation-in-part of Ser. No. 697,018, Aug. 16, 1996, Pat. No. 5,669,979, which is a continuation of Ser. No. 532,992, Sep. 25, 1995, abandoned, and a continuation-in-part of Ser. No. 647,145, May 9, 1996, abandoned, which is a continuation of Ser. No. 428,667, Apr. 25, 1995, abandoned, which is a continuation-in-part of Ser. No. 298,023, Aug. 29, 1994, abandoned, which is a continuation-in-part of Ser. No. 118,806, Sep. 8, 1993, abandoned.

[51] Int. Cl.$^6$ .................................................. B08B 3/12
[52] U.S. Cl. .............................. 134/1; 134/19; 134/201
[58] Field of Search ................... 134/56 R, 57 R, 134/58 R, 201, 102.2, 1, 7, 19; 15/302, 320; 250/205

[56] References Cited

U.S. PATENT DOCUMENTS

| | | |
|---|---|---|
| 3,118,437 | 1/1964 | Hunt . |
| 3,364,088 | 1/1968 | Solomon et al. . |
| 3,464,534 | 9/1969 | Muncheryan . |
| 3,503,804 | 3/1970 | Schneider . |
| 3,890,176 | 6/1975 | Bolon . |
| 4,004,152 | 1/1977 | Obser et al. . |
| 4,028,135 | 6/1977 | Vig et al. . |
| 4,160,166 | 7/1979 | Etienne et al. . |
| 4,181,538 | 1/1980 | Narayan et al. . |
| 4,292,093 | 9/1981 | Ownby et al. . |
| 4,305,973 | 12/1981 | Yaron et al. . |
| 4,393,311 | 7/1983 | Feldman et al. . |
| 4,414,059 | 11/1983 | Blum et al. . |
| 4,475,027 | 10/1984 | Pressley . |
| 4,484,334 | 11/1984 | Pressley . |
| 4,508,749 | 4/1985 | Brannon et al. . |

(List continued on next page.)

FOREIGN PATENT DOCUMENTS

| | | |
|---|---|---|
| 0 585 936 A2 | 9/1994 | European Pat. Off. . |
| 58-031528 | 2/1983 | Japan . |
| 60-198437 | 10/1985 | Japan . |
| 62-127655 | 6/1987 | Japan . |
| 63-19809 | 1/1988 | Japan . |
| 1-239837 | 9/1989 | Japan . |
| 5-215692 | 8/1993 | Japan . |
| 5-226790 | 9/1993 | Japan . |
| WO 91/03075 | 7/1991 | WIPO . |

OTHER PUBLICATIONS

ABLasers, Waferlase, "A breakthrough from A–B Lasers: Trouble–free wafer marking that won't take over your clean room" Product Description, (published before Aug. 29, 1993.

Arrowsmith, "Laser Ablation of Solids for Elemental Analysis by Inductively Coupled Plasma Mass Spectrometry", Analytical Chemistry, 59:1437–1444 (1987).

Brannon et al., "Eximer laser etching of polyimide", J. Appl. Phys., 58:2036–2047, (1985).

Brewer, "Large Area Laser–Assisted Etching of Electronic Materials", SPIE, 611;62–69, (1986).

(List continued on next page.)

*Primary Examiner*—Frankie L. Stinson
*Attorney, Agent, or Firm*—Fish & Richardson P.C.

[57] ABSTRACT

Foreign material on a surface of a substrate is processed to form a non-solid by-product by providing a gaseous reactant in the vicinity of the foreign material and delivering a beam of radiation to aid the gaseous reactant to react with the foreign material to form the non-solid by-product.

In another aspect, radiation for cleaning a surface of a substrate is provided by a laser configured to deliver an original beam of ultraviolet radiation, and optics (e.g., a pair of orthogonal cylindrical mirrors) for shaping the beam to have a cross-section in the form of a line having a width smaller than any dimension of a cross-section of the original beam and a length at least ten times larger than any dimension of the original beam.

34 Claims, 5 Drawing Sheets

U.S. PATENT DOCUMENTS

| | | |
|---|---|---|
| 4,568,632 | 2/1986 | Blum et al. . |
| 4,582,540 | 4/1986 | Allback . |
| 4,615,765 | 10/1986 | Levinson et al. . |
| 4,643,799 | 2/1987 | Tsujii et al. . |
| 4,668,304 | 5/1987 | Schachameyer et al. . |
| 4,671,848 | 6/1987 | Miller et al. . |
| 4,680,616 | 7/1987 | Delahoy et al. . |
| 4,687,539 | 8/1987 | Burns et al. . |
| 4,692,583 | 9/1987 | Kimura et al. . |
| 4,705,593 | 11/1987 | Haigh et al. . |
| 4,718,974 | 1/1988 | Minaee . |
| 4,731,158 | 3/1988 | Brannon . |
| 4,731,516 | 3/1988 | Noguchi et al. . |
| 4,733,944 | 3/1988 | Fahlen et al. . |
| 4,749,440 | 6/1988 | Blackwood et al. . |
| 4,756,047 | 7/1988 | Hayashi et al. . |
| 4,782,029 | 11/1988 | Takemura et al. . |
| 4,786,358 | 11/1988 | Yamazaki et al. . |
| 4,857,142 | 8/1989 | Syverson . |
| 4,870,923 | 10/1989 | Sugimoto . |
| 4,877,644 | 10/1989 | Wu et al. . |
| 4,900,395 | 2/1990 | Syverson et al. . |
| 4,938,815 | 7/1990 | McNeilly . |
| 4,946,763 | 8/1990 | Snakenborg . |
| 5,004,311 | 4/1991 | Peppers . |
| 5,007,983 | 4/1991 | Lerner et al. . |
| 5,022,961 | 6/1991 | Izumi et al. . |
| 5,024,968 | 6/1991 | Engelsberg . |
| 5,044,314 | 9/1991 | McNeilly . |
| 5,099,557 | 3/1992 | Engelsberg . |
| 5,114,834 | 5/1992 | Nachshon . |
| 5,151,134 | 9/1992 | Boquillon et al. . |
| 5,151,135 | 9/1992 | Magee et al. . |
| 5,214,685 | 5/1993 | Howells . |
| 5,217,559 | 6/1993 | Moslehi et al. . |
| 5,228,206 | 7/1993 | Grant et al. . |
| 5,234,540 | 8/1993 | Grant et al. . |
| 5,236,512 | 8/1993 | Rogers et al. . |
| 5,254,176 | 10/1993 | Ibuka et al. . |
| 5,279,705 | 1/1994 | Tanaka . |
| 5,289,263 | 2/1994 | Kiyokawa et al. . |
| 5,454,902 | 10/1995 | Zinck et al. . |
| 5,480,492 | 1/1996 | Udagawa et al. . |
| 5,531,857 | 7/1996 | Engelsberg et al. . |
| 5,534,107 | 7/1996 | Gray et al. . |

OTHER PUBLICATIONS

Brewer, "Photon–assisted dry etching of GaAs", Appl. Phys. Lett. 45:475–477, (1984).

Chuang, "Laser enhanced gas–surface chemistry: Basic processes and applications", J. Vas. Sci. Technol., 21:798–806, (1982).

Czaplicki, "Bar Code Screening", Packaging Encyclopedia, p. 102, (1989).

Davis et al., "Direct Photoetching of Resist Materials Using Excimer Lasers", pp. 1–8, Microcircuit Engineering, 83, (1983).

Elliott, D.J., "Contamination Control Using a Nitrogen Purged Mini–Environment", Microcontamination 90 Conference Proceedings, Mar. 1993, Boston, MA.

Encyclopedia of Chemical Technology, "Hydrogen–Ion Activity to Laminated Materials, Glass", vol. 13, pp. 628–631.

Garrison, "Microscopic model for the ablative photodecomposition of polymers by far–ultraviolet radiation (193 nm)", Appl. Phys. Lett., vol. 44, No. 9 (May 1984).

Garrison et al., "Laser ablation of organic polymers: Microscopic models for photochemical and thermal processes", J. Appl. Phys., vol. 57, No. 8 (Apr. 1985).

Goldman et al., "Laser–matter interaction at intensities of $10^{12}$ W/cm$^2$ and below", SPIE, vol. 1279 (1990).

Huie et al., "Spatial and Temporal Distributions of Particulates Formed from Metallic Surfaces by Laser Vaporization", (1986).

Jellinek, "Theory of Etching of Polymers by Far–Ultraviolet, High–Intensity Pulsed Laser and Long–Term Irradiation", J. Phys. Chem., vol. 88, No. 14 (1984).

Keyes et al., "Theory of Photoablation and Its Implications for Laser Phototherapy", J. Phys. Chem., vol. 89, No. 20 (1985).

Layden et al., "High velocity carbon dioxide snow for cleaning vacuum system surfaces", pp. 3881–3883, J. of Vacuum Science & Technology A, vol. 8, No. 5, Sep./Oct. 1990.

Lambdaphysik, "Glass marking", Oct. 1986.

Lambdaphysik "Scan marking: application to metal marking", Feb. 1987.

Leitz–IMS "Alpha Alignment Mark Photoablation System" (Sep. 1986).

Leitz–IMS "Alpha Alignment Mark Photoablation System" (published before Aug. 29, 1993).

Leitz–IMS "News Release" (Apr. 15, 1986).

Leitz–IMS "XLR–100 Excimer Laser Research Center" (1986).

Listing for Abstracts —A.

Listing of Abstracts–B.

Listing of Abstracts–C.

Loper et al., "UV laser–generated fluorine atom etching of polycrystalline Si, Mo, and Ti", Appl. Phys. Lett., vol. 46, No. 7 (Apr. 1985).

FIG. 3 as originally filed in Nachshon, U.S. Ser. No. 260,526, filed Oct. 21, 1988, corresponding to the parent application of U.S. Pat. No. 5,114,834.

Peterson et al., "Contamination Removal by $CO_2$ Jet Spray", Proceedings SPIE–The International Society for Optical Engineering, Jul. 10–12, 1990.

Peterson et al., "Jet Spray Cleaning of Optics", Proceedings SPIE–The International Society for Optical Engineering, Jul. 23–24, 1992.

Fusion Semiconductor, Primaxx™, Gas Phase Cleaning Module brochure (Jan. 1994).

Fusion 200 ACU Asher–Product Description (published before Aug. 29, 1993).

Jerzy Ruzyllo, "Overview of Dry Wafer Cleaning Processes", pp. 201–231, Handbook of Semiconductor Wafer Cleaning Technology (published before Aug. 29, 1993).

Schildbach, "A simple analytic model including shielding by the plume during Excimer laser ablation of polyimide", SPIE, vol. 1279 (1990).

"Photoablation' with Excimer Laser Improves Alignment", Semiconductor International, Dec. 1986.

Applied Optics, vol. 23, No. 5, Mar. 1984.

Brewer et al., "Laser–Assisted Dry Etching", 273–80, Solid State Technology, (1985).

Boehly et al., "Measurements of mass ablation rate and pressure in planar targets irradiated by 0.27–$\mu$m laser light", J. Appl. Phys. 60:3840–3844, (1986).

Ehrlich et al., "Laser–induced microscopic etching of GaAs and InP", Appl. Phys. Lett., vol. 36, No. 8 (Apr. 1980).

Bolon et al., "Ultraviolet Depolymerization of Photoresist Polymers", pp. 109–111, Polymer Engineering and Science, vol. 12, No. 2, Mar. 1972.

Elliott et al., "VLSI Surface Processing with Excimer Lasers", Semicon East Technical Program, Boston, MA Sep. 1986.

Elliott et al., "Materials Surface Processing with Excimer Lasers", Materials Research Society Fall Meeting and Show Technical Program, Boston, MA, Dec. 2, 1986.

Elliott, D.J., "Integrated Circuit Fabrication Technology", 2nd Edition, p. 145, McGraw Hill, New York, N.Y., 1989.

Elliott et al., "Materials Surface Processing with Excimer Lasers", pp. 1090–1096, Proceedings of the International Conference on Lasers '87, Dec. 7–11, 1987.

Elliott et al., "Photoablation of Resist Coated Alignment Targets to Improve VLSI Pattern Overlay", pp. 172–175, SPIE, vol. 774 (1987).

Elliott, "Electronic Materials Surface Processing with Excimer Lasers", Microelectronic Engineering, pp. 435–444 (1986).

Elliott, D.J., "Integrated Circuit Mask Technology," pp. 50–58, McGraw Hill, New York, N.Y. 1985.

Decker, "Kinetic analysis of laser–induced reactions in polymer films", SPIE, 1279:50–59, (1990).

Dyer et al., "Excimer laser ablation and thermal coupling efficiency of polymer films", J. Appl. Phys., 57:1420–1422, (1985).

Kokai, et al., "X–ray photoelectron spectroscopy studies on polymer surfaces after KrF laser ablation", SPIE, 1190:95–103, (1989).

Sherman et al., "The removal of hydrocarbons and silicone grease stains from silicon wafers", pp. 563–567, J. of Vacuum Science & Technology B, vol. 8, No. 3, May/Jun. 1990.

Shumay, "New Laser Applications in Microelectronics", Advanced Materials & Processes, (1986).

Sowell et al., "Surface cleaning by ultraviolet radiation", Journal of Vacuum Science & Technology, vol. 11, No. 1, (Jan./Feb. 1974).

Srinivasan, "Ablation of Polymers and Biological Tissue by Ultraviolet Lasers", Science, vol. 234 (Oct. 1986).

Srinivasan, "Action of Far–Ultraviolet Light on Organic Polymer Films: Applications to Semiconductor Technology", Journal of Radiation Curing (1983).

Srinivasan et al., "Ablative Photodecomposition of Polymer Films by Pulsed Far–Ultraviolet (193 nm) Laser Radiation . . . ", Journal of Polymer Science: Polymer Chemistry Edition, vol. 22, 2601–2609 (1984).

R. Srinivasan, "UV laser ablation of polymeres and biological tissues", Lamda Highlights No. 1 (published before Aug. 29, 1993).

R. Srinivasan, "Ultraviolet Laser Ablation of Organic Polymer Films", IBM Thomas J. Watson Research Center, Yorktown Heights, N.Y. (1984).

Surface Preparation (published before Aug. 29, 1993).

Sutcliffe et al., "Dynamics of UV laser ablation of organic polymer surfaces", J. Appl. Phys., vol. 60, No. 9 (Nov. 1986).

Vig, "Ultraviolet–Ozone Cleaning of Semiconductor Surfaces", Research and Development Technical Report SLC-ET–TR–91–33 (Jan. 1992).

John R. Vig, "Ultraviolet–Ozone Cleaning of Semiconductor Surfaces", pp. 233–273, Handbook of Semiconductor Wafer Cleaning Technology (published before Aug. 29, 1993).

Vig, "UV/Ozone Cleaning of Surfaces", Treatise on Clean Surface Technology, Plenum Press, pp. 1–26 (1987).

Zapka et al., "Efficient pulse laser removal of 0.2 $\mu m$ sized particles from a solid surface", pp. 2217–2219, Appl. Phys. Lett. 58 (20), 20 May 1991.

PHOTOREACTIVE SURFACE CLEANING

CROSS REFERENCE TO RELATED APPLICATIONS

This application is a continuation-in-part of U.S. Ser. No. 08/697,018, filed Aug. 16, 1996, now U.S. Pat. No. 5,669,979 which is a continuation of Ser. No. 08/532,992, filed Sep. 25, 1995, now abandoned, and a continuation-in-part of Ser. No. 08/647,145, filed May 9, 1996, now abandoned, which is a continuation of Ser. No. 08/428,667, filed Apr. 25, 1995, now abandoned, which is a continuation-in-part of Ser. No. 08/298,023, filed Aug. 29, 1994, now abandoned, which is a continuation-in-part of Ser. No. 08/118,806, filed Sep. 8, 1993, now abandoned.

BACKGROUND OF THE INVENTION

This invention relates to surface cleaning.

Surface cleaning is an important step in making, e.g., semiconductor memories, printed circuits, flat panel displays, and CD-ROMs. Surface contaminants have a direct bearing on process yields, especially as device sizes become smaller. For example, even a monolayer of sodium ion contamination on the surface of an integrated circuit may cause the circuit to malfunction. Surface cleaning also plays an important role in the biotechnology and medical fields, e.g., in the manufacture and purification of culture strains, and in the cleaning of surgical instruments.

Surface contaminants frequently comprise organic molecules. Although it has long been known that ultraviolet (UV) light decomposes organic molecules, only in the last few years has UV cleaning of surfaces been explored.

In one cleaning scheme, a surface, contaminated by adsorbed hydrocarbons, is irradiated with UV light from a low pressure mercury discharge lamp in an atmosphere of oxygen. The contaminants absorb the UV radiation and become excited. At low energy levels the bonds between the contaminant molecules and the surface tend to break and an inert gas can be used to carry away the debris. At higher energy levels some contaminant molecules tend to dissociate from the surface into free radicals which react with atomic oxygen, produced by the dissociation of ozone, to form carbon dioxide, water and nitrogen, while other contaminants tend to heat and expand quickly away from the surface.

In another cleaning scheme, a surface is irradiated in ambient air by laser pulses aimed normal to the surface to produce a spot size of several millimeters. Surface contaminants absorb the UV laser pulses, expand from highly localized heating, and accelerate away from the surface. The resulting particles are carried away with water or inert gas.

Experiments (at IBM) have shown that using a thin film of water between the surface of a wafer and an incident laser beam facilitates the removal of surface contaminants. Energy transferred from the laser beam to the water film causes explosive boiling of the water, thus ejecting the contaminants from the surface of the wafer.

SUMMARY OF THE INVENTION

In general, in one aspect, the invention features a method of processing foreign material on a surface of a substrate to form a non-solid by-product, in which a gaseous reactant is provided in the vicinity of the foreign material, and a beam of radiation is delivered to aid the gaseous reactant to react with the foreign material to form the non-solid by-product.

Embodiments of the invention include the following features. The radiation is delivered to the vicinity of the foreign material at an energy level insufficient to damage the surface. The gaseous reactant is provided and the beam of radiation is delivered at a long, narrow reaction region at the surface. The beam has a long and narrow cross-sectional shape achieved by shaping a source laser beam so that the cross-sectional size of the beam is focused in one dimension and broadened in the other dimension. The surface and the beam are moved relative to one another to cause the beam to sweep the surface.

The gaseous reactant is provided as a flowing stream having a broad dimension and a narrow dimension to the reaction region in a direction which includes a component parallel to the surface. A nozzle having a slit shaped opening delivers the gaseous reactant. The gaseous reactant is selected to match reaction characteristics of the foreign material and be compatible with the underlying substrate. The energy characteristics of the beam are selected to match absorption characteristics of the foreign material.

Embodiments of the invention provide an inducer gas in the vicinity of, or mixed with, the gaseous reactant to control (i.e., accelerate, decelerate or otherwise change the characteristics of) the reaction between the gaseous reactant and the foreign material.

In general, in another aspect, the invention features providing radiation for cleaning a surface of a substrate using a laser configured to deliver an original beam of ultraviolet radiation, and optics (e.g., a pair of orthogonal cylindrical mirrors) for shaping the beam to have a cross-section in the form of a line having a width smaller than any dimension of a cross-section of the original beam and a length at least ten times larger than any dimension of the original beam.

Among the advantages of the invention are the following.

The photoreactive cleaning process converts surface contaminants from a solid to a gas form at the surface without attempting to break the bonds adhering the contaminants to the surface; instead the contaminants are converted into volatile by-products in situ. This makes it easier to transport the reactant products from the surface. High efficiency is achieved by selecting reaction parameters which are tuned for the particular contaminants that are to be removed, thereby maximizing the energy transfer from the laser to the reaction products and minimizing the energy transfer, and thus the possibility of damage (e.g., due to heat or to electrical currents), to circuitry and other features on the surface, and to the surface itself.

Photoreactive surface cleaning provides important advantages to the semiconductor industry. Cleaning with radiant energy and low volumes of reactant gases results in low volumes of relatively harmless oxidation products and thus reduces the impact on the environment, as well as increases operator safety, compared with the standard wafer cleaning practice in the semiconductor industry of employing large volumes of acids, bases, solvents, and even larger volumes of contaminated rinse water. In addition, the cleaning cost for wafer cleaning will be an estimated one-twentieth of the cost associated with conventional cleaning methods. The use of a single chamber and a reaction zone as wide as a wafer diameter allows single-pass surface cleaning, with an estimated cleaning time for a 200 mm diameter wafer of between 30 and 60 seconds. Also, photoreactive surface cleaning eliminates the problems associated with conventional plasma, and early ultra-violet, cleaning methods of electrical fields, induced currents and high energy reactions which are potentially harmful to semiconductor devices and substrates.

The size of the smallest particle capable of causing a defect in an integrated circuit is decreasing as the semiconductor industry pushes for smaller circuit dimensions. The fact that the strength of the adhesive forces bonding a contaminant to a surface (e.g., van der Waals' forces) increases, as the size of the contaminant decreases, poses a particularly difficult problem for surface cleaning techniques which rely on breaking these adhesive forces to physically remove these small contaminants, in that the energy required to remove the contaminants becomes comparable to the energy sufficient to damage a surface (e.g., 10,000 psi of pressure is not sufficient to remove 0.25 micron particles from a semiconductor surface). Photoreactive surface cleaning, on the other hand, can remove 0.25 micron and smaller particles from a surface without damage.

Other advantages and features will become apparent from the following description and from the claims.

DESCRIPTION

STRUCTURE

Figure 1:
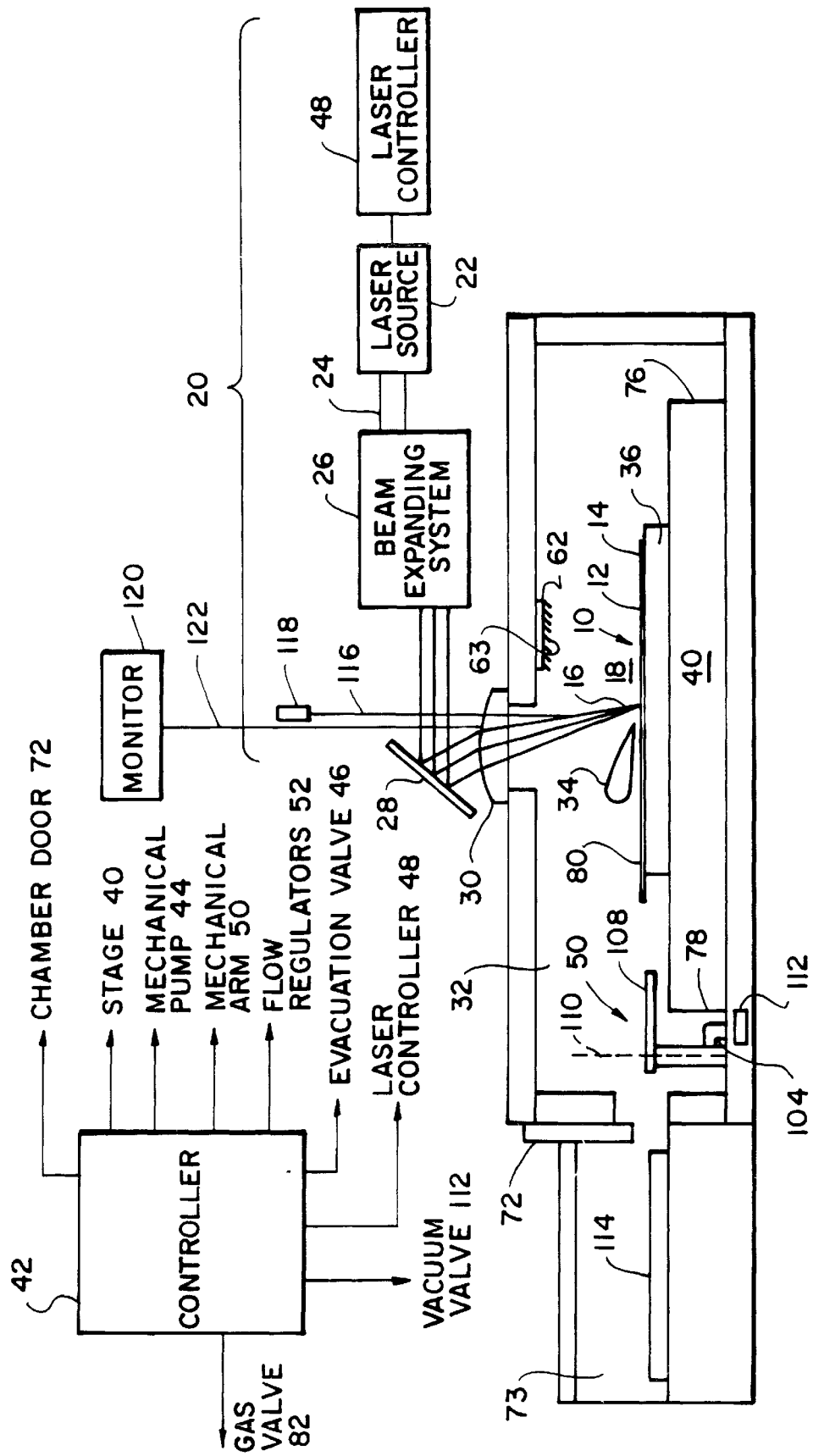
FIG. 1 is a schematic side view of a surface cleaning station.
Figure 2:
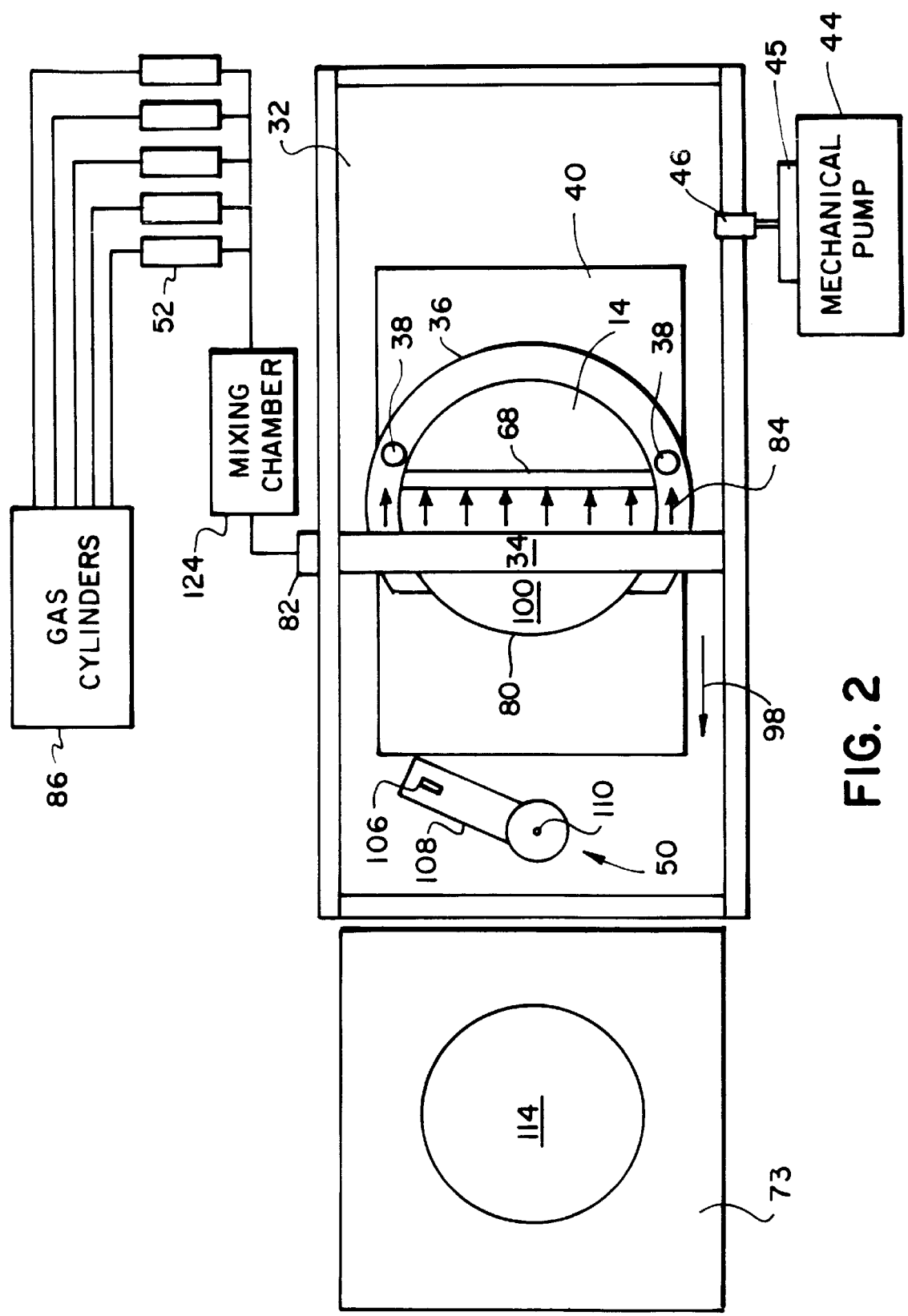
FIG. 2 is a schematic top view of a surface cleaning station.

Referring to FIGS. 1 and 2, contaminants 10 (too small to be shown) on a surface 12 of an eight-inch diameter semiconductor wafer 14 are removed by a photoreactive process in which energy in a knife-edge shaped laser beam 16 is absorbed by the contaminants which undergo a photoreactive chemical process in the presence of a controlled atmosphere 18 (comprising a reactive gas). The gaseous product of the photoreactive process is then removed leaving no particulate residue. The laser energy is arranged to be insufficient to damage surface 12.

The laser beam is shaped and delivered via an optical system 20 that includes a laser source 22, which delivers a conventional rectangular cross-section beam 24 via a beam expanding system 26, a cylindrical mirror 28 (which shapes the beam into a knife-shaped cross-section) and a lens 30. The lens 30 is a cylindrical refractive lens made from fused silica which allows visual inspection of the reaction chamber during a photoreactive cleaning procedure, which may be useful for monitoring the progress of a reaction as well as for end-point detection.

The controlled atmosphere of reactive gas is provided within a closed reaction chamber 32, which is sufficiently sealed to hold a subambient pressure of about 1 Torr. A stream of reactive gas is blown at the region where the laser beam is striking the contaminants by a nozzle 34. Additional reactive gas is delivered to and withdrawn from the reaction chamber as explained below to provide a desired pressure of reactive gas within the chamber.

The reaction chamber also contains mechanical equipment to support the wafer and move it into and out of the chamber. The wafer is held securely by a conventional wafer chuck 36 which has protruding banking pins 38 spaced by about 120 degrees to hold the wafer in place. The chuck is mounted on a translation stage 40. Translation stage 40 is electrically driven to move the wafer chuck back and forth within the reaction chamber at a constant rate (e.g., about 6.5 mm/sec) specified by a controller 42.

For purposes of controlling a surface cleaning sequence, controller 42 is also connected to a mechanical pump 44, an evacuation valve 19, laser beam controller 48, an electrically driven mechanical arm 50, mass flow regulators 52, vacuum valve 112, gas valve 82, and chamber door 72.

Figure 3:
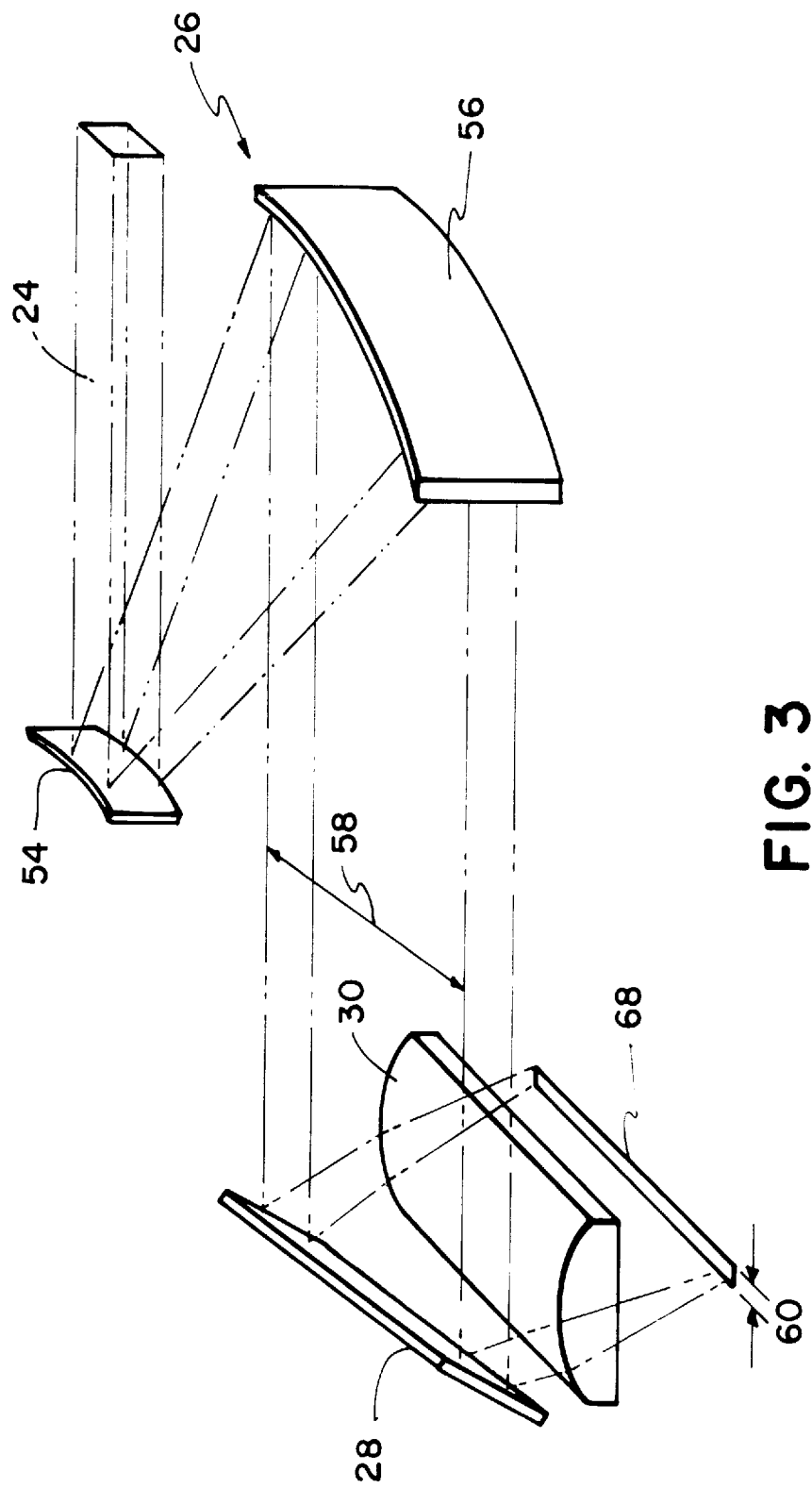
FIG. 3 is a perspective view of a beam expanding system.

Laser source 22 may be an excimer laser (for example, a Cymer CX-2 excimer laser available from Cymer Laser Technologies of San Diego, Calif., USA), which generates a pulsed beam 24 at wavelengths of 248 nm and 193 nm. Other lasers could be used, e.g., a tunable Alexandrite solid state pulsed laser in combination with a frequency multiplier. As shown in FIG. 3, the cross-sectional dimensions of the beam may be in the range of 3 mm×5 mm to 5 mm×15 mm. The beam expanding system 26 includes a pair of cylindrical mirrors 54 and 56, with vertical cylinder axes, which expand the beam along one dimension to a width 58 of 200–250 mm.

A mirror 28 delivers beam 24 to a lens 30 (a cylindrical refractive lens) which focuses beam 24 so that at the place where it strikes the surface it has a width of less than 0.5 mm along dimension 60. Thus the final beam striking the surface gives the appearance of a knife edge. Lens 30 also serves as a window allowing visual inspection of the inside of the reaction chamber during a photoreactive cleaning procedure.

For efficient use of space, the entire optical system (i.e., the laser and the cylindrical mirrors) is mounted on the top of reaction chamber 32. A beam dump 62 (FIG. 1) with a surface that strongly absorbs radiant energy in the range 157–250 nm (e.g., a block of hard-anodized aluminum with a row of narrow vanes 63 oriented in the direction of the reflected laser beam), is mounted inside the reaction chamber to receive radiant energy reflected from the wafer surface during surface cleaning.

Figure 4:
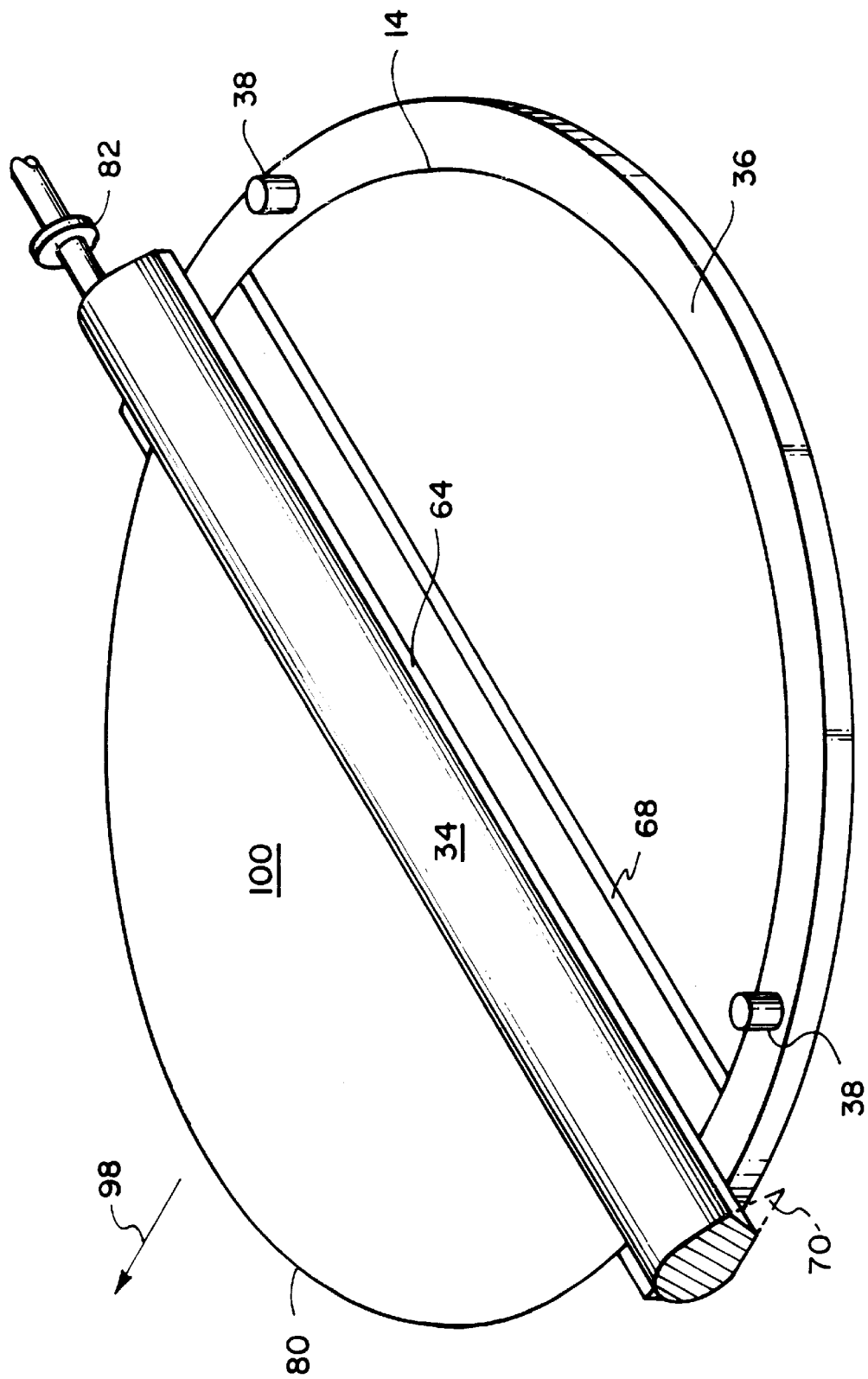
FIG. 4 is a perspective view of a gas delivery system.

As shown in FIG. 4, nozzle 34 has a long rectangular slit 64 which directs gaseous reactants 66 onto wafer 14 with a relatively uniform pressure of 1–30 psi horizontally across a reaction zone 68. Slit 64 is positioned about 2–5 mm above the surface of the wafer and about 1–10 mm to the left of (in the sense of FIG. 1) the reaction zone and is aimed at an angle 70 of between 0 and 15 degrees, measured from the plane of the wafer. A heating element may be provided at the end of nozzle 34, or at valve 82, to adjust the temperature of the reactant products.

Operation

A surface cleaning operation using the equipment described above proceeds in the following way.

Prior to cleaning, an appropriate set of reaction parameters (e.g., energy wavelength, energy density of the incident laser beam, gas composition, pressure of the reactant gas inside the reaction chamber, stage translation rate, and gas pressure and temperature at the nozzle slot) are selected. These will depend on the type of contaminant present, which can be determined by Auger analysis or by ESCA (electron scattering chemical analysis).

Many contaminants found on wafers are inherent to semiconductor cleanrooms; these include particulates from the air (e.g., dust, lint, gas-phase oxides and metals, and atmospheric debris), and from process technicians (e.g., skin). The steps required for processing a wafer into a finished product also contribute to surface contamination (e.g.: polymer residues, photoresist monolayers and silicon dust from integrated circuit processing; copper, epoxy, and phenolic from printed circuit fabrication; and oxides and glass from flat panel display manufacturing).

While the majority of contaminants found on wafers comprise organic molecules (consisting of carbon, hydrogen, oxygen, nitrogen, sulfur, trace metals, such as iron and sodium, and trace oxides), many other types of surface contaminants exist, such as metals (e.g., sodium, aluminum, brass and gypsum), silicon, and oxides (e.g., silicon oxide and aluminum oxide), each requiring different reaction parameters for efficient removal.

Once the contaminants have been identified and the parameters selected, wafer 14 is loaded into reaction chamber 32 through door 72 from a Portable Cleanroom™ Wafer Transport System 73 (described below), and is positioned on wafer chuck 36 against banking pins 38 by mechanical arm 50, with the surface to be cleaned facing up.

Figure 5:
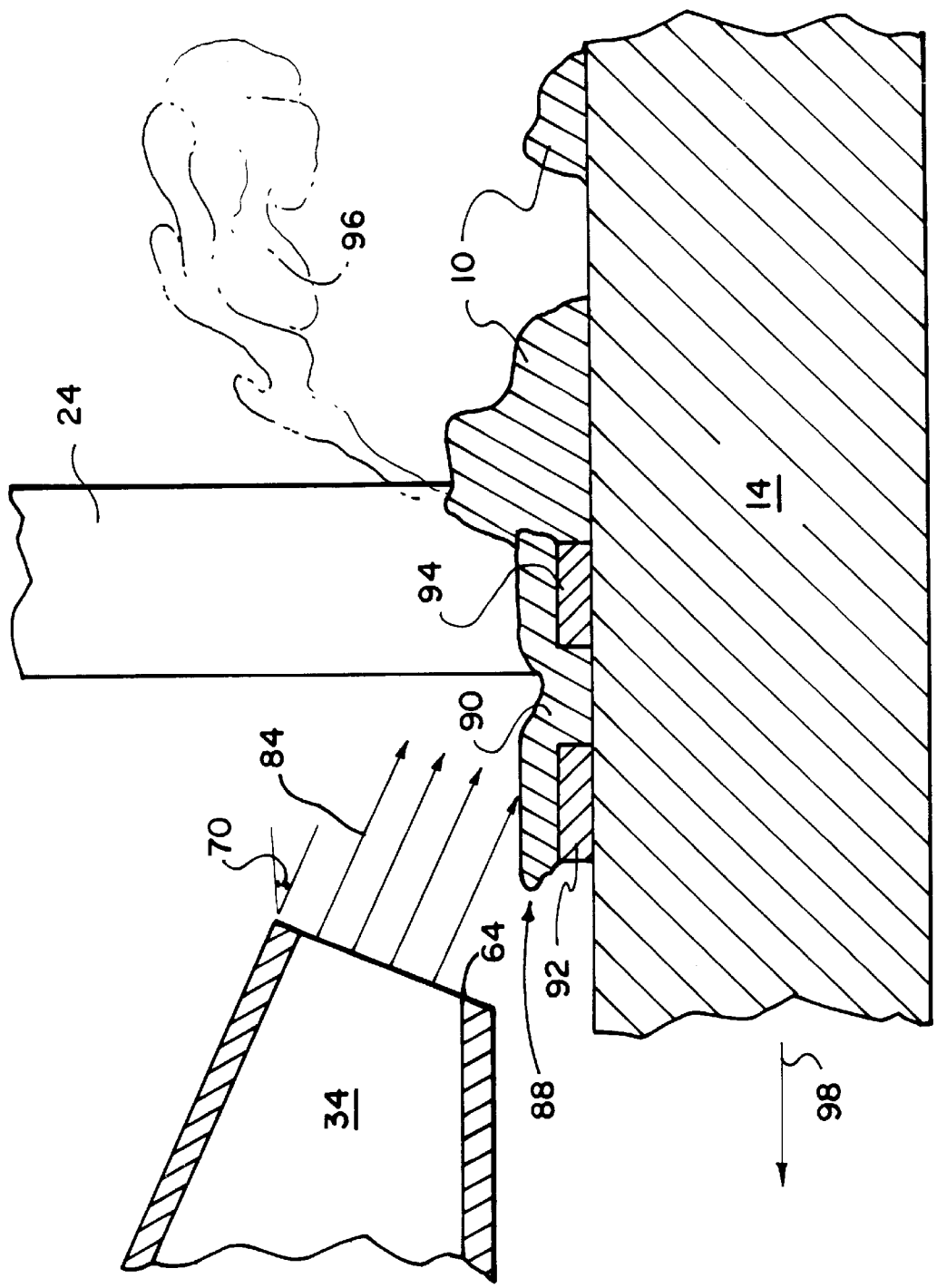
FIG. 5 is an enlarged cross sectional view of a wafer during a photoreactive surface cleaning procedure.

Mechanical pump 44 pumps on the reaction chamber until a pressure of between 1 and 10 Torr is achieved, at which point the stage 40 translates the chuck 36 and wafer 14 at a constant rate across the reaction chamber from a rear end 76 to a forward end 78. As shown in FIG. 5, as soon as the forward edge 80 of the wafer reaches reaction zone 68, the controller 42 electrically actuates a gas valve 82 to coordinate the delivery of the mixture of gaseous reactants (indicated by arrows 84), specified by mass flow regulators 52, from gas cylinders 86, through nozzle 34. When the pressure within the reaction chamber reaches a desired pressure (e.g., between 10 Torr and 1 atmosphere), the controller 42 activates laser source 22 and laser beam pulses 24 are delivered to reaction zone 68.

The surface 12 of silicon wafer 14 may include a device 88, e.g., a MOS (metal-oxide-semiconductor) transistor, comprising an aluminum metal layer 90 and oxide layers 92 and 94, and surface contaminants 10. Laser beam pulses 24 and gaseous reactants 84 in the reaction zone cooperate to cause a photo-activated reaction between the gaseous reactants and the contaminants, producing gaseous products 96 that are removed from the reaction chamber through evacuation valve 46 by mechanical pump 44 through a charcoal filter 45 (see FIG. 2). The mixture of gaseous reactants 84 is delivered in a direction opposite the direction of wafer translation (indicated by arrow 98) in order to preferentially propel gaseous products 96 away from the forward end 100 of the wafer, which has been cleaned.

The energy density of the focused beam at reaction zone 68 should be as uniform as possible, however energy density variations of up to 10% can be tolerated without causing significant non-uniformity in the removal of the contaminants from the surface of the wafer. Photoreactive cleaning is a highly efficient means for removing surface contaminants. Damage to device 88 or to the wafer surface itself, which could be caused by energy transfer from the laser or by localized heating, is minimized by limiting the reactive area to a small portion of the wafer surface at a time. By absorbing a portion of the laser energy, the presence of the reactant gas, by allowing the photolytic reaction to take advantage of chemical reactions, also helps to prevent damage to the wafer surface, as well as relax the uniformity requirement of the knife-blade laser pulse.

The energy density and linear sweep rate (i.e., the number of pulses striking a given point on the surface of the wafer per unit time) is chosen according to the particular surface contaminant that is being selected for removal. Typical energy density levels at 248 nm are in the range of 250–1500 $mJ/cm^2$. The use of a 200 mm to 250 mm wide reaction zone permits efficient single-pass cleaning.

After the entire surface of the wafer has passed beneath the reaction zone 68, and depending on the kind of processing the wafer was subjected to prior to being cleaned in reaction chamber 32 and the type of post-processing the wafer is to undergo, the surface 12 of the wafer may be cleaned, as many times as required without removing the wafer from the reaction chamber, under different reaction conditions. It may be necessary, for example, to proceed with a surface oxide cleaning procedure subsequent to a surface cleaning targeted to removing organic molecules. This is due to the fact that during an organic cleaning sequence, metals, as well as the silicon substrate, may become oxidized.

Once the surface of wafer 14 has been cleaned, the gas valve 82 is closed and the wafer may be removed from the reaction chamber and loaded into a Portable Cleanroom™ Wafer Transport System 73, by mechanical arm assembly 50 (e.g., a class 1 robotic substrate handler available from ADE Corporation of Newton, Mass., USA) which is coupled to vacuum line 104 and has a slot 106 on arm 108. The Portable Cleanroom™ (described in the inventor's U.S. Pat. No. 4,668,484) is an enclosed wafer carrier that typically has an ambient nitrogen atmosphere with a pressure slightly greater than one atmosphere. The mechanical arm assembly 50 is electrically controlled and is capable of rotating about axis 110. Arm 108 can be controllably extended or retracted horizontally (i.e., in the plane of FIG. 2).

The reaction chamber 32 is purged in a conventional manner with nitrogen gas from cylinders 86 until the chamber reaches a pressure of slightly greater than 1 atmosphere, which matches the pressure inside the transport chamber 73, at which point controller 42 opens door 72 between the reaction chamber 32 and the portable cleanroom. Controller 42 then directs the translation stage to position the wafer chuck 36 at the forward end 78 of the reaction chamber 32 and causes the mechanical arm assembly 50 to rotate about axis 110, and arm 108 to extend toward wafer 14, so that slot 106 lies completely under the wafer. The controller opens the vacuum valve 112 between slot 106 and vacuum line 104, thereby causing wafer 14 to be held by arm 108.

Mechanical arm assembly 50, with wafer 14 affixed to arm 108 at slot 106, rotates about axis 110 approximately 180 degrees. Arm 108 extends toward wafer holder 114, until the wafer is centered over holder 114. Controller 42 closes the valve between vacuum line 104 and slot 106 so that the wafer is released from arm 108 and may be held by wafer holder 114.

Arm 50 retracts and rotates from between the reaction chamber and the transport chamber 73, and controller 42 closes door 72 of the reaction chamber 32.

Targeting Procedure

Tuning the photoreaction cleaning procedure begins with identifying the particular contaminants on the wafer surface with either Auger analysis or ESCA. The appropriate wavelength of laser energy coincides, as closely as possible, with the peak in the absorption characteristics of a given contaminant (noting that the amount of laser energy reaching the contaminant also depends on the absorption characteristics of the surrounding atmosphere). For example, for a layer of highly cross-linked photoresist (e.g., a resist mask used for an ion implantation procedure), a wavelength of 193 nm could be used, because it is a relatively higher photon energy, while for an uncross-linked novolak resist layer (i.e., "developer scum"), a wavelength of 248 nm, which is a relatively lower photon energy, would be more effective. The choice of energy density and stage translation rate depends on the thickness, as well as the absorption characteristics, of the contaminant. In the above examples, the ion implanted resist would be efficiently removed with an energy density of 1000 $mJ/cm^2$ and a stage translation rate of 4 mm/sec, while removal of the developer scum would only require an energy density of 500 $mJ/cm^2$ and a stage translation rate of 6 mm/sec. The other parameters (i.e., the pressure of the reactant gas inside the reaction chamber, and the gas pressure and temperature at the nozzle slot), as well as the above-cited parameters are all to be empirically worked out.

Proper selection of the reaction parameters minimizes electrical fields, induced currents, and heating of the substrate, all of which could cause damage to the wafer surface or the circuitry on the wafer surface.

The choice of reactant gas employed in a photoreactive cleaning procedure is guided by the type of contaminant to be removed. Examples of proposed photoreactive cleaning contaminant/reactive gas combinations are provided below.

Example 1

For the removal of organic contaminants, such as dust (comprising carbon, hydrogen, oxygen, trace metals and trace oxides), polymer residues (comprising fluorinated and chlorinated carbon-based molecules), and photoresist monolayers (comprising carbon, hydrogen, nitrogen, sulfur, and trace concentrations of iron, sodium and other trace metals) the following photoreactive cleaning step would be performed:

(1) use ultra-violet (UV) laser pulses with a wavelength between 157 nm and 250 nm in combination with oxygen gas to remove the initial organic contaminant layer -

UV(light)+$O_2$+C→CO(gas)+$CO_2$(gas)  UV (light)+{H, N, S}+$O_2$→{$H_2O$, $NO_2$, $SO_2$}(gas).

Example 2

The initial organic cleaning step (example 1) usually causes the oxidation of aluminum metal layers according to:
$4Al+3O_2\rightarrow 2Al_2O_3$.

The following gases may be employed to remove native aluminum oxide:

(1) UV laser pulses with chlorine gas -
UV(light)+$2Al_2O_3$+$6Cl_2$→$4AlCl_3$(gas)+$3O_2$(gas);

(2) UV laser pulses with boron chloride gas -
UV(light)+$Al_2O_3$+$BCl_3$→$2AlCl_3$(gas)+$B_2O_3$(gas).

Example 3

The initial organic cleaning step (example 1) usually causes the oxidation of the silicon substrate according to:
$Si+O_2\rightarrow SiO_2$.
To remove silicon oxide films the following gases may be used with UV laser pulses:

(1) UV (light)+$3SiO_2$+$O_2$+$2C_2F_6$→$3SiF_4$(g)+$4CO_2$(g);

(2) UV (light)+$SiO_2$+$CF_4$→$SiF_4$(gas)+$CO_2$(gas).

Example 4

To remove silicon films the following gases may be used in combination with UV laser pulses:

(1) UV (light)+$3Si$+$4O_2$+$2C_2F_6$→$3SiF_4$(g)+$4CO_2$(g);

(2) UV (light)+$Si$+$O_2$+$CF_4$→$SiF_4$(gas)+$CO_2$(gas).

Example 5

To remove metal- and oxide- bearing residues chlorine gas may be used with UV laser pulses:

(1) UV (light)+$2Al_2O_3$+$6Cl_2$→$4AlCl_3$(gas)+$3O_2$(gas);

(2) $Si+2Cl_2\rightarrow SiCl_4$.

The above examples are simplified to show the strategy of targeting the contaminant with the appropriate gas.

Additional gases, referred to as inducer gases, may be added from gas cylinders 86 to accelerate the excitation of the reactant gas, thereby enhancing the efficiency of the reaction between the reactant gas and the surface contaminants. The addition of inducer gases is particularly useful for removal highly cross-linked polymer residues.

Depending on the particular parameters used in the reaction chamber, an inducer gas may act as an absorber of UV radiation or as a diluent, which serves to reduce the concentration of the reactant species, which may be employed for controlling the reaction rate between the reactant gas and the contaminants, or for creating a minimum reaction energy threshold for limiting the production of undesirable reaction products (e.g., ozone and hazardous polymer-based reaction products). Examples of diluent gas molecules include nitrogen, helium and argon. Nitrogen acts mainly to impede the reaction between the contaminants and the reactant gas, while argon tends to impede the diffusion of the primary reactant gas molecules, rather than to participate in a reaction. Helium behaves in an intermediate manner between nitrogen and argon.

Under different reaction parameters an inducer gas may act as a catalyst for the reaction between the reaction gas and the contaminants. For example, an inducer gas comprising a polyatomic molecule may be used to accelerate the dissociation of oxygen in the reaction chamber according the following reaction equation:

$O_2$+(inducer gas)+UV(light)→2O

Examples of inducer gases include $NH_3$, $H_2$, $N_2O$ and $C_xF_y$ (i.e., fluorocarbons).

Inducer gases, acting to control the rate of a photoreactive surface cleaning, play an important role in cleaning delicate surfaces or membranes that have low damage thresholds. For example, a pellicle, which comprises a thin polymer membrane that is transparent to the light used to expose wafers in photolithography, stretched above a mask or reticle in a wafer stepper to keep dust and other debris from falling on the optical equipment and causing a defect to be produced in resist film, is very difficult to clean by conventional techniques because the tight thickness and uniformity tolerances required preclude any damage to the surface of the pellicle. A high speed, low energy photoreactive surface clean that may be suitable to clean a pellicle surface without damage would comprise laser pulses with a wavelength of 248 nm and an energy density of about 250 mJ/cm$^2$, and a stage translation rate of about 8 mm/sec. An inducer gas of nitrogen, helium or argon would be added to a reactant gas species of oxygen to suppress the formation of excited oxygen species and thus slow down the oxidation process and minimize the damage to the pellicle surface.

Photoreactive surface cleaning has an important application in the surface treatment of medical instruments prior to their use in surgery. The use of UV light may be used to remove bacteria and other contaminants that could cause problems in a medical environment from instruments too delicate or otherwise incompatible with conventional autoclave systems. For example, small plastic optical fibers used for non-invasive surgery are easily damaged by the high energy or high temperature cleaning procedures used in hospitals today (e.g., plasma and high temperature chemical treatment). A suitable photoreactive surface cleaning would comprise laser energy at a wavelength of 248 nm and an energy density of 250 mJ/cm$^2$, a stage translation rate of 10 mm/sec, oxygen gas and an inducer gas (i.e., one of $NH_3$, $H_2$, $N_2O$ or $C_xF_y$)

Other embodiments are within the scope of the claims.

For example, the laser beam could be delivered at an angle other than ninety degrees to the surface of the wafer.

The width of slot 100 of the gas nozzle 34 can be made adjustable to optimize the gas flow rate for particular contaminants.

As shown in FIG. 1, a diagnostic laser beam 116 from a helium-neon laser 118 may be introduced into the reaction chamber through lens 30 with the beam from laser source 22. Monitor 120 could be configured to receive a reflected diagnostic beam 122 to verify that a surface has been cleaned without having to remove the surface from the reaction chamber (e.g., by interferometric or light scattering techniques well-known in the field of surface analysis). Unlike prior diagnostic techniques used to monitor the cleaning of surfaces (e.g., spectrum analyzers used for plasma etching systems), the photoreactive cleaning scheme allows convenient analysis of a surface, in situ, without exposing the surface analyzing equipment to the atmosphere inside the reaction chamber, which might damage the analyzing equipment or might contaminate the reaction chamber.

The mirror 28 and the lens 30 shown in FIGS. 1 and 3, may be replaced with a flat (non-focussing) window and a cylindrical mirror with a horizontal axis.

As shown in FIG. 2, a mixing chamber 124 may be connected between the mass flow meters 52 and the gas valve 82. The mixing chamber comprises a small stainless steel chamber with baffles located in the flow paths of the gases from the mass flow meters 52 to create a turbulent atmosphere inside the mixing chamber which results in a homogenous mixture of the reactant gases prior to entering the reaction chamber.

What is claimed is:

1. A photoreactive method of removing foreign material from a surface of a substrate to form a non-solid by-product comprising the steps of:

providing a flow of a gaseous reactant in a reaction region in the vicinity of said foreign material; and delivering a beam of radiation to aid said gaseous reactant to react with said foreign material to form said non-solid by-product;

said beam of radiation and said gaseous reactant interacting in said reaction region to create a foreign material reaction environment that chemically interacts with and that removes said foreign material from said substrate surface and converts said foreign material to said non-solid by-product.

2. The method of claim 1 wherein said radiation is delivered to said vicinity of said foreign material at an energy level insufficient to damage said surface.

3. The method of claim 1 wherein said beam of radiation has a width of 200–250 millimeters at said reaction region at said surface.

4. The method of claim 3 wherein said energy level at said surface is in the range of 250–1500 mJ/cm$^2$.

5. The method of claim 3 further comprising providing a series of reflective and refractive optical elements to impart to said beam at said reaction region a cross-sectional shape which is long and narrow.

6. The method of claim 5 wherein said imparting comprises receiving a source laser beam and focusing the cross-sectional size of said beam in one dimension and broadening the cross-sectional size in the other dimension.

7. The method of claim 5 further comprising causing relative motion between said surface and said beam to cause said beam to sweep said surface.

8. The method of claim 1 further comprising selecting said gaseous reactant to match reaction characteristics of said foreign material.

9. The method of claim 8 further comprising controlling the energy characteristics of said beam to match absorption characteristics of said foreign material.

10. The method of claim 9 wherein said beam comprises ultra-violet radiation.

11. The method of claim 10 wherein said gaseous reactant comprises a member of the group consisting of chlorine, fluorine, and molecules containing fluorine or chlorine.

12. The method of claim 1 wherein said foreign material, comprises organic material, said reactant comprises oxygen, and said beam comprises ultra-violet radiation.

13. The method of claim 1 wherein said foreign material comprises a metal oxide, said reactant comprises chlorine or a chorine containing molecule, and said beam comprises ultra-violet radiation.

14. The method of claim 1 wherein said foreign material comprises silicon or silicon oxide, said reactant comprises a fluorocarbon, and said beam comprises ultra-violet radiation.

15. The method of claim 1 wherein said foreign material comprises bacteria, said reactant gas comprises oxygen, and said beam comprises ultra-violet radiation.

16. The method of claim 1 further comprising providing an inducer gas in the vicinity of said gaseous reactant to assist said gaseous reactant to react with said foreign material.

17. The method claim 16 wherein said inducer gas comprises a member of the group consisting of $NH_3$, $H_2$, $N_2O$, and fluorocarbons.

18. The method of claim 1 further comprising providing an inducer gas in the vicinity of said gaseous reactant to suppress the formation of a reaction by-product.

19. The method of claim 1 further comprising providing a diluent gas to slow the reaction between said foreign material and said gaseous reactant.

20. The method of claim 19 wherein said diluent gas comprises a member of the group consisting of nitrogen, helium and argon.

21. The method of claim 1 further comprising delivering a diagnostic beam of radiation to monitor said surface during said processing.

22. A photoreactive method of processing foreign material on a surface of a substrate to a non-solid by-product, comprising the steps of:

selecting a gaseous reactant to match reaction characteristics of said foreign material providing a flowing stream of said gaseous reactant at a reaction region which is at the location of said foreign material on said surface, and delivering a beam of radiation that has a long and narrow cross-sectional shape in said reaction region in the vicinity of said foreign material to aid said gaseous reactant to chemically react with said foreign material to form said non-solid by-product, said beam having energy characteristics to match absorption characteristics of said foreign material, said radiation being delivered to said reaction region at an energy level insufficient to damage said surface, and removing said by-product from said reaction region.

23. The method of claim 22 further comprising providing said gaseous reactant as a flowing stream to said vicinity of said foreign material.

24. The method of claim 23 wherein said gaseous reactant is provided and said beam of radiation is delivered at a reaction region at said surface and said flowing stream is provided in a broad stream to said reaction region.

25. The method of claim 24 wherein said broad stream is delivered in a direction which includes a component parallel to said surface.

26. The method of claim 25 further comprising causing relative motion of said substrate and a source of said broad stream toward one another.

27. Apparatus for processing foreign material on a surface of a substrate to form a non-solid by-product, comprising
   a supply of a gaseous reactant, nozzle structure for providing a flowing stream of said gaseous reactant in the vicinity of said foreign material, and
   structure for providing a beam of radiation, and
   optics configured to impart to said beam a cross-sectional shape which is long and narrow in the vicinity of said foreign material to aid said gaseous reactant to react with said foreign material to form said non-solid by-product.

28. The apparatus of claim 27 wherein said optics includes reflective and refractive elements.

29. The apparatus of claim 27 further comprising
   structure for causing relative motion between said surface and said beam to cause said beam to sweep said surface.

30. The apparatus of claim 27 wherein said nozzle has a slit shaped orifice.

31. The apparatus of claim 27 further comprising
   a chamber for containing said substrate and said reactant during said processing, said chamber having a window configured to assist delivery of said beam to said vicinity of said foreign material.

32. Apparatus for providing radiation for cleaning a surface of a substrate comprising
   a laser configured to deliver an original beam of ultraviolet radiation, and
   optics for shaping said beam to have a cross-section in the form of a line having a width smaller than any dimension of a cross-section of said original beam and a length at least ten times larger than any dimension of said original beam.

33. The apparatus of claim 32 wherein said optics comprise
   a pair of cylindrical optical elements having respective axis held perpendicular to one another.

34. The apparatus of claim 33 wherein said optics comprise a cylindrical lens.

* * * * *